(12) United States Patent
Chen et al.

(10) Patent No.: US 9,099,421 B2
(45) Date of Patent: Aug. 4, 2015

(54) SURFACE PROFILE FOR SEMICONDUCTOR REGION

(71) Applicant: Taiwan Semiconductor Manufacturing Company Limited, Hsin-Chu (TW)

(72) Inventors: Chao-Hsuing Chen, Tainan (TW); Ling-Sung Wang, Tainan (TW); Chi-Yen Lin, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 51 days.

(21) Appl. No.: 13/665,159

(22) Filed: Oct. 31, 2012

(65) Prior Publication Data

US 2014/0117512 A1    May 1, 2014

(51) Int. Cl.
*H01L 29/36* (2006.01)
*H01L 21/02* (2006.01)
*H01L 21/66* (2006.01)

(52) U.S. Cl.
CPC .......... *H01L 29/36* (2013.01); *H01L 21/02587* (2013.01); *H01L 22/12* (2013.01); *H01L 22/20* (2013.01)

(58) Field of Classification Search
None
See application file for complete search history.

(56) References Cited

U.S. PATENT DOCUMENTS

| | | | | |
|---|---|---|---|---|
| 6,831,350 B1 * | 12/2004 | Liu et al. | | 257/617 |
| 8,449,731 B1 * | 5/2013 | Pradhan et al. | | 204/192.3 |
| 2006/0169669 A1 * | 8/2006 | Zojaji et al. | | 216/58 |
| 2006/0234504 A1 * | 10/2006 | Bauer et al. | | 438/674 |
| 2009/0075029 A1 * | 3/2009 | Thomas et al. | | 428/173 |

* cited by examiner

*Primary Examiner* — Steven Loke
*Assistant Examiner* — Juanita B Rhodes
(74) *Attorney, Agent, or Firm* — Cooper Legal Group, LLC

(57) ABSTRACT

One or more techniques or systems for controlling a profile of a surface of a semiconductor region are provided herein. In some embodiments, an etching to deposition (E/D) ratio is set to be less than one to form the region within the semiconductor. For example, when the E/D ratio is less than one, an etching rate is less than a deposition rate of the E/D ratio, thus 'growing' the region. In some embodiments, the E/D ratio is subsequently set to be greater than one. For example, when the E/D ratio is greater than one, the etching rate is greater than the deposition rate of the E/D ratio, thus 'etching' the region. In this manner, a smooth surface profile is provided for the region, at least because setting the E/D ratio to be greater than one enables etch back of at least a portion of the grown region.

20 Claims, 5 Drawing Sheets

US 9,099,421 B2

SURFACE PROFILE FOR SEMICONDUCTOR REGION

BACKGROUND

Generally, a region of a semiconductor, such as a region formed based on epitaxial growth or chemical vapor deposition (CVD), is associated with a surface profile that is rough. For example, such roughness is associated with RC tailing, undulation, or looser contact landings.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for controlling a surface profile for a region of a semiconductor are provided herein. Generally, a region is formed based on at least one of epitaxial growth or chemical vapor deposition (CVD). During formation, the region is associated with an etching to deposition (E/D) ratio. For example, the E/D ratio is set to a first number less than one during formation, at least because an etching rate of the E/D ratio is less than a deposition rate of the E/D ratio. In this way, the region is formed, at least because the E/D ratio provides for a net deposition, for example. In some embodiments, the region comprises a surface associated with a surface profile. For example, the surface profile of the surface of the region is rough at least due to a nature of formation of the region. In some embodiments, the E/D ratio is set to a second number greater than one to etch back at least a portion of the region, such as when formation is at a desired thickness. In this way, the surface profile of the surface of the region is controlled to smooth the surface of the region by etching back at least the portion of the region. Accordingly, the surface profile for the region of the semiconductor is smoothed.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
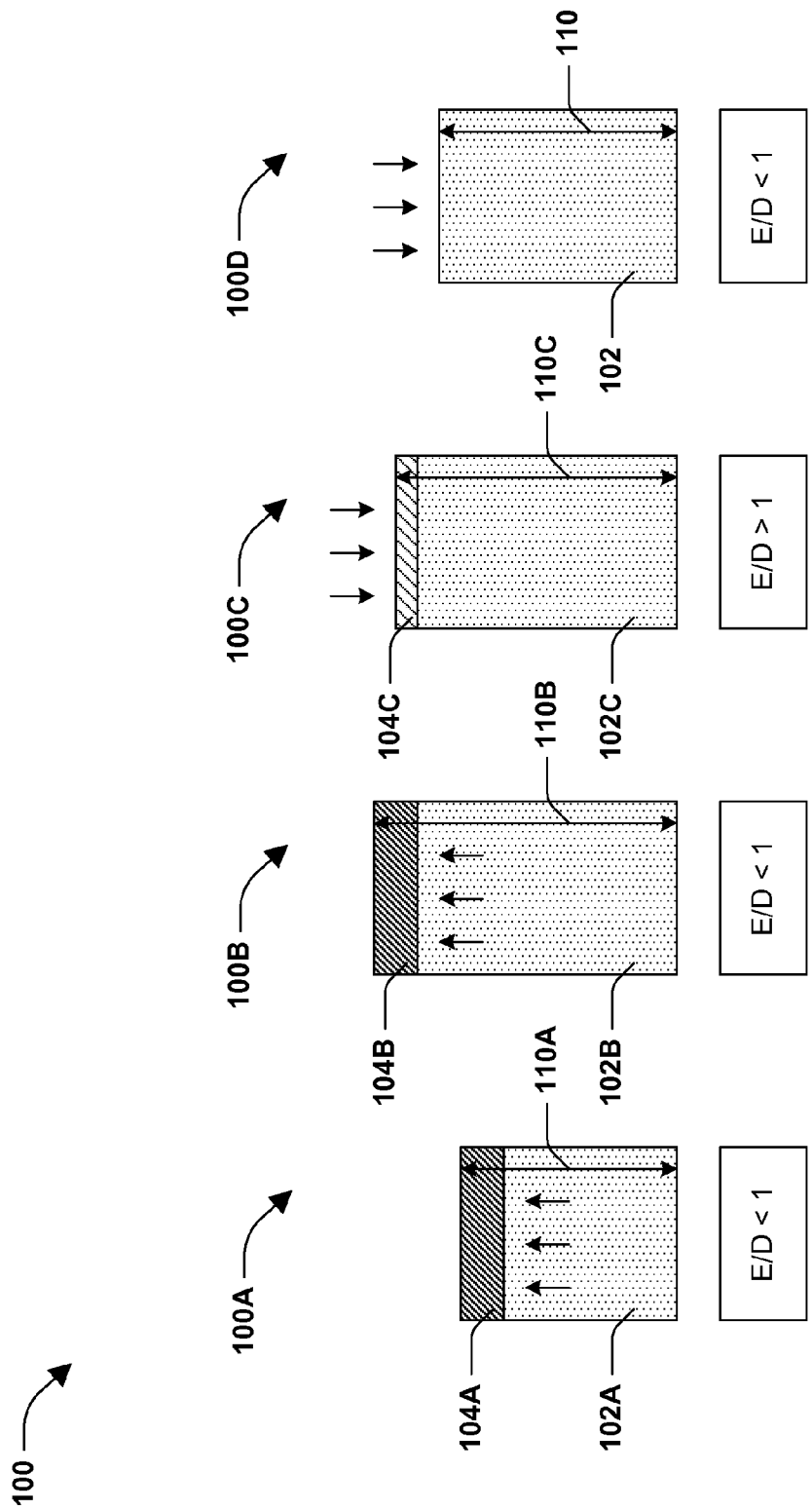
FIG. 1 is a cross-sectional view of an example region of a semiconductor associated with a controlled surface profile during formation, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

It will be appreciated that a region is generally formed based on at least one of epitaxial growth or chemical vapor deposition (CVD). In some examples, formation of the region is associated with an etching to deposition (E/D) ratio. For example, when the E/D ratio is less than one, a deposition rate of the E/D ratio is greater than an etching rate of the E/D ratio. Accordingly, when the E/D ratio is less than one, the region is associated with a net deposition, as a whole. For example, if the etching rate is one nanometer per minute and the deposition rate is four nanometers per minute, the E/D ratio is 0.25 and three nanometers are deposited on the region per minute. Conversely, when the E/D ratio is greater than one, a deposition rate of the E/D ratio is less than an etching rate of the E/D ratio. Accordingly, when the E/D ratio is greater than one, the region is associated with a net etch, as a whole. For another example, if the etching rate is four nanometers per minute and the deposition rate is one nanometer per minute, the E/D ratio is four and three nanometers are etched from the region per minute.

FIG. 1 is a cross-sectional view 100 of an example region of a semiconductor associated with a controlled surface profile during formation, according to some embodiments. In some embodiments, a region 102 is formed during a first time, a second time, or a third time. For example, 100A and 100B are associated with formation of the region 102 at the first time. Additionally, 100C and 100D are associated with formation of the region 102 at the second time and third time, respectively. In some embodiments, the second time is after the first time and the third time is after the second time. At 100A, region 102A is formed based on at least one of epitaxial growth, chemical vapor deposition (CVD), etc. In some embodiments, region 102A comprises a surface 104A. According to some examples, 104A is associated with a surface profile that is rough. In some embodiments, region 102A is associated with a thickness 110A. Additionally, an E/D ratio associated with region 102A of 100A at the first time is less than one, according to some embodiments, at least because the region 102A is being formed. In some embodiments, the E/D ratio is set to a first number less than one during at least one of formation of the region 102 or the first time. At 100B, region 102B is formed and comprises surface 104B. Similarly, 104B is associated with a rough surface profile. Additionally, region 102B is associated with a thickness 110B greater than 110A. In some embodiments, the E/D ratio associated with region 102B of 100B is the same as the E/D ratio associated with region 102A of 100A. In some embodiments, the E/D ratio associated with 100B is less than one. In some embodiments, the second time is determined based on a thickness of a region. For example, the second time is determined when thickness 110B of region 102B is greater than a desired thickness, such as ten nanometers, for example. It will be appreciated that while the E/D ratio is less than one, the thickness of the region, such as 110B of region 102B, will grow as time passes. At 100C, region 102C is formed or etched back at a second time, according to some embodiments. For example, region 102C comprises surface 104C. According to some aspects, 104C is associated with a surface profile that is smoother than the surface profile of 104B, for example. In some embodiments, region 102C is associated with a thickness 110C. For example, thickness 110C is less than thickness 110B of 100B, at least because the E/D ratio of 100C is adjusted accordingly. For example, the E/D ratio associated with 100C is set to be a second number greater than one at the second time, at least because when the E/D ratio is greater than one, 104C is etched back or trimmed, thereby smoothing or trimming surface 104C. At 100D, region 102 is formed according to some embodiments, at least because surface 104C is at least one of trimmed, etched back, smoothed, or removed. According to some aspects, region 102 is associated with a surface profile that is smoother than the surface profile of 104C, for example. In some embodiments, region 102 is associated with a thickness 110 less than thickness 110C of 100C. In some embodiments, the E/D ratio associated with 100D is returned to the first number less than one, such as at the third time. Accordingly, region 102 of 100D continues growth after etch back of surface 104C, for example. In this way, the surface profile for region 102 is controlled or smoothed, and associated surface roughness or undulation is mitigated. In this way, a smoother or flat surface for region 102 is provided. Additionally, it will be appreciated that the etch back enables improved contact landing and RC distribution, thus mitigating RC tailing or noise associated with a semiconductor comprising region 102, for example.

Additionally, in some embodiments, a first material is applied to the region 102 as a boost for a device or a semiconductor comprising the region 102. For example, Germanium (Ge) is applied to the region 102 to boost the device. In some embodiments, the application of Ge induces or is associated with compressive stress, thus enhancing at least one of electron mobility or hole mobility for the region 102. In some embodiments, the smoothing associated with the etch back of region 102 mitigates stress relaxation associated with a rough surface profile, thus enhancing at least one of electron mobility or hole mobility for the region 102. In some embodiments, a concentration of the first material, such as a Ge concentration, is adjusted based on the E/D ratio. For example, when the E/D ratio is set to the first number at a first time, the first material is applied at a first concentration. Additionally, when the E/D ratio is set to the second number at a second time, the first material is applied at the second concentration, where the second concentration is different than the first concentration, at least because a change in the E/D ratio affects a distribution of the first material, for example. In some embodiments, when the E/D ratio is set to the first number at a third time, the first material is applied at the first concentration. In some embodiments, the second concentration is determined based on at least one of the first number, the second number, a difference between the first number and the second number, a rate of change between the first number and the second number, etc. In some embodiments, at least one of the first number or the first concentration is a baseline, for example. In some embodiments, a surface roughness is associated with at least one of surface 104A, surface 104B, surface 104C, or region 102. In some embodiments, the surface roughness associated with region 102 is from at least about five nanometers in grain size to at least about forty nanometers in grain size. However, it will be appreciated that in other embodiments, the surface roughness is at least one of greater than forty nanometers in grain size or less than five nanometers in grain size.

Figure 2:
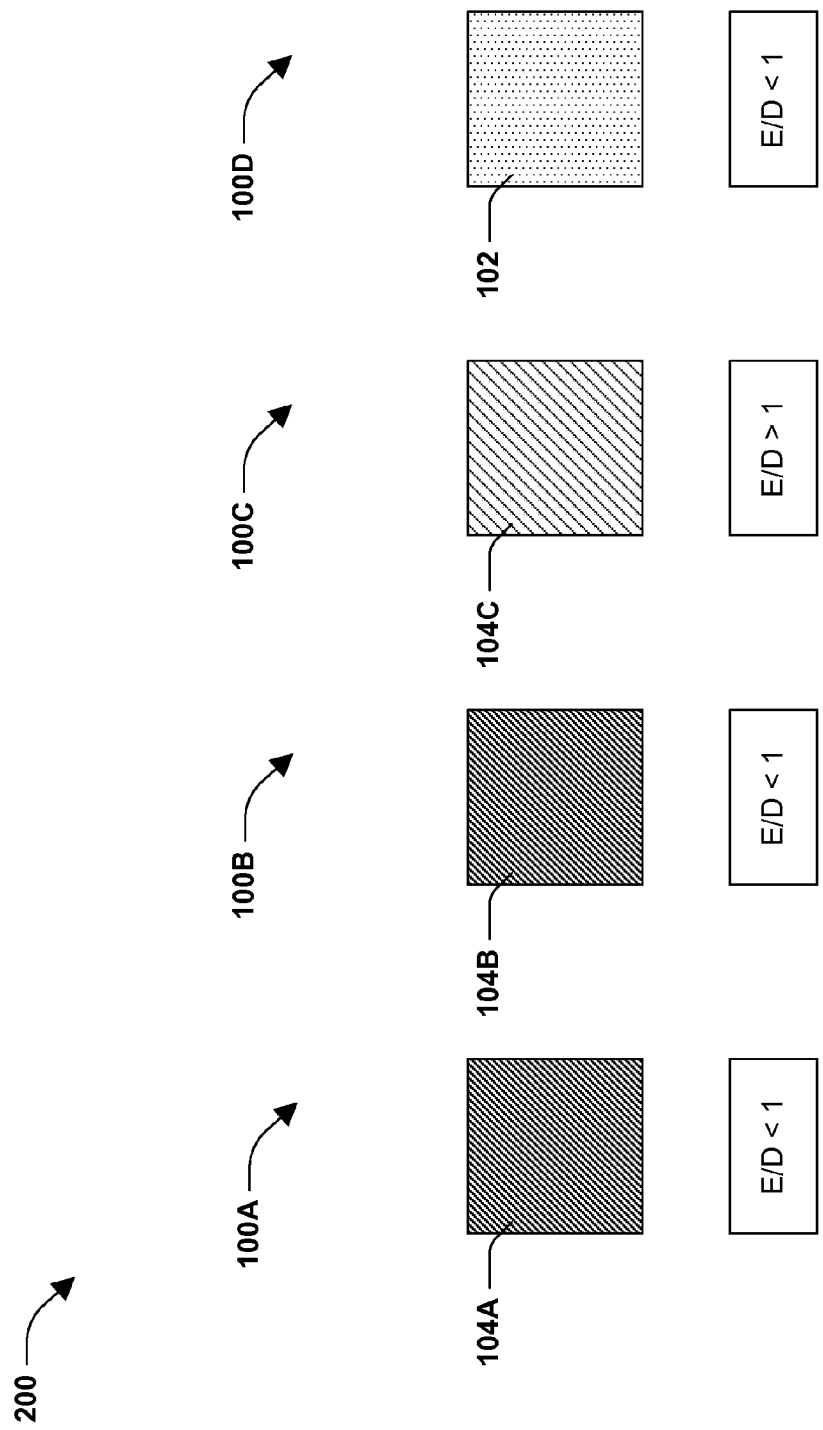
FIG. 2 is a top-down or layout view of an example region of a semiconductor associated with a controlled surface profile during formation, according to some embodiments.

FIG. 2 is a top-down or layout view 200 of an example region of a semiconductor associated with a controlled surface profile during formation, according to some embodiments. It will be appreciated that FIG. 2 is similar to FIG. 1, except that 100A, 100B, 100C, and 100D are associated with top-down views of regions in FIG. 2, rather than the cross-sectional views of FIG. 1. For example, 100A is associated with a first time. Additionally, a surface 104A of region 102 is grown, at least because the E/D ratio associated with 100A is set to a first number less than one. Similarly, 100B is associated with surface 104B of region 102, where the E/D ratio is less than one. In some embodiments, 100B is associated with the first time. In some embodiments, at least one of surface 104A or 104B is associated with a rough surface profile. In some embodiments 100C is associated with a second time after the first time. At 100C, at least a portion of surface 104C of region 102 is etched back, at least because the E/D ratio associated with 100C is adjusted to be greater than one. For example, the E/D ratio is adjusted to be greater than one at a third time. In some embodiments, the E/D ratio is set to be less than one based on a thickness of region 102, such as 110 of 100D of FIG. 1, for example. It will be appreciated that a surface profile of surface 104C is smoother than the surface profiles of surfaces 104A and 104B, at least because the E/D ratio of 100C is set to a second number greater than one, enabling at least some of the surface 104C to be etched back or smoothed. At 100D, the surface 104C of region 102 is removed to expose region 102. In some embodiments, 100D is associated with a third time. It will be appreciated that a surface profile of region 102 is smoother than the surface profiles of surfaces 104A,104B, or 104C, at least because the rough surface profiles of surfaces 104A,104B, or 104C are at least one of etched back, removed, or smoothed. In some embodiments, the E/D ratio is returned to the first number less than one at the third time.

Figure 3:
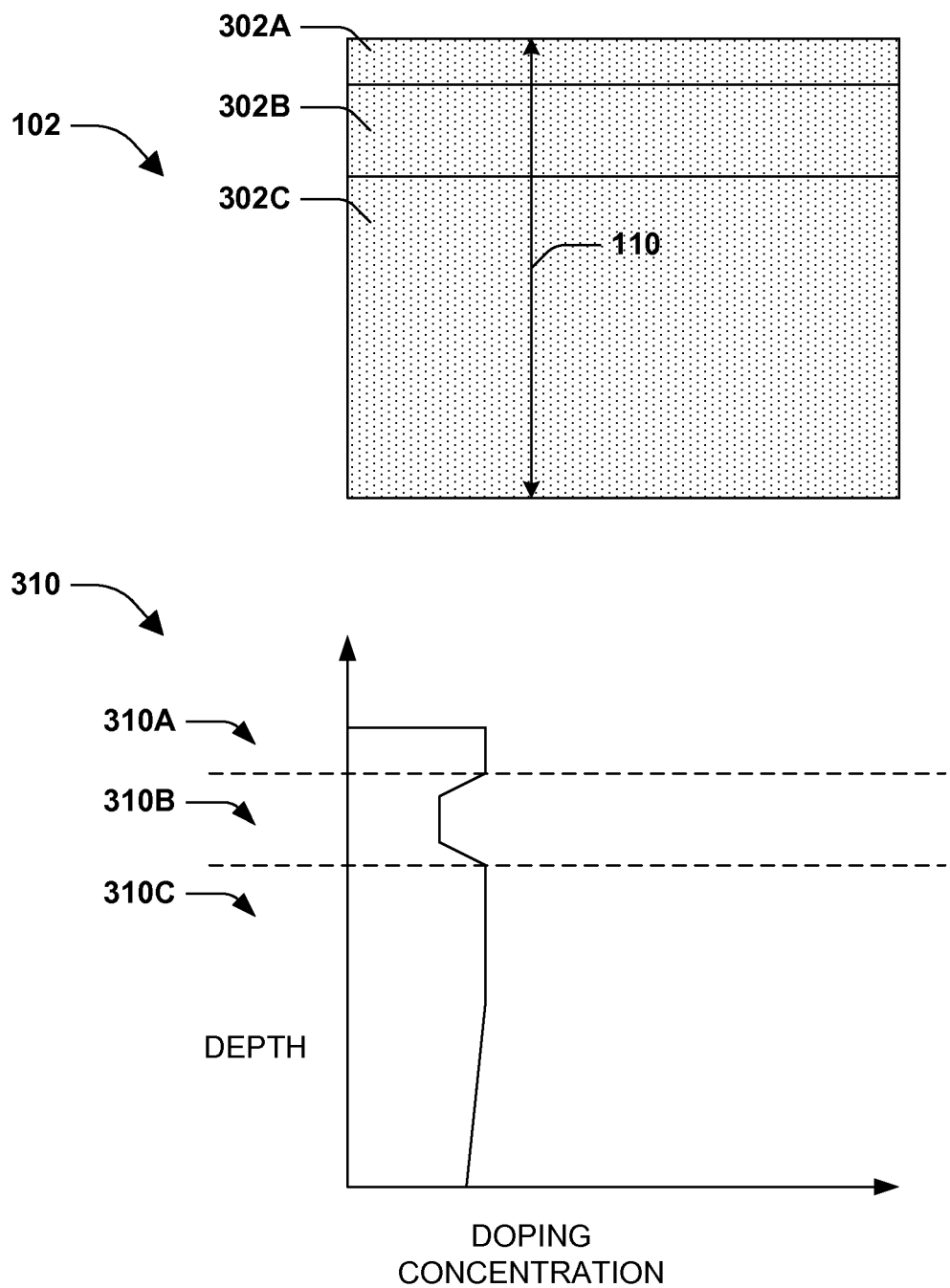
FIG. 3 is an example region of a semiconductor associated with a controlled surface profile and an associated doping concentration graph, according to some embodiments.

FIG. 3 is an example region 102 of a semiconductor associated with a controlled surface profile and an associated doping concentration graph 310, according to some embodiments. For example, the region 102 of FIG. 3 comprises a first sub-region 302A, a second sub-region 302B, and a third sub-region 302C. Additionally, the region 102 is associated with a thickness 110. In some embodiments, the region 102 of FIG. 3 is the same region as region 102 of 100D of FIG. 1. In some embodiments, the region is formed based on epitaxial growth or chemical vapor deposition (CVD). Accordingly, an etching to deposition (E/D) ratio is associated with the formation of region 102. For example, at a first time, when the third sub-region 302C is being formed, the E/D ratio is set to a first number, such as a number less than one. In some embodiments, when the E/D ratio is less than one, a deposition rate of the E/D ratio is greater than an etching rate for the E/D ratio. Accordingly, a net deposition is associated with the E/D ratio less than one, thus forming the third sub-region 302C. Additionally, at a second time, when the second sub-region 302B is being formed, the E/D ratio is set to a second number, such as a number greater than one. In some embodiments, when the E/D ratio is greater than one, a deposition rate of the E/D ratio is less than an etching rate for the E/D ratio. Accordingly, a net etching is associated with the E/D ratio greater than one, thus etching back (not shown) at least a portion of the second sub-region 302B. Additionally, at a third time, when the first sub-region 302A is being formed, the E/D ratio is set to be less than one, such as the first number, for example. Accordingly, the first sub-region 302A is formed. In some embodiments, the third sub-region 302C is below at least some of the second sub-region 302B and the second sub-region 302B is below at least some of the first sub-region 302A. For example, the first sub-region 302A is at a surface of region 102. In some embodiments, a first material is applied to at least one of at least some of the first region 102, the first sub-region 302A, the second sub-region 302B, or the third sub-region 302C during formation. For example, applying the first material to the respective regions or sub-regions enables compressive stress to be induced such that at least one of electron mobility or hole mobility is enhance for at least one of the respective region or sub-regions, for example. In some embodiments, Germanium (Ge) is applied to at least one of at least some of the region 102, the first sub-region 302A, the second sub-region 302B, or the third sub-region 302C. Additionally, in some embodiments, different concentrations of the first material are applied at different times, such as based on the E/D ratio. For example, when the E/D ratio is less than one, a first concentration of the first material is applied. In another example, when the E/D ratio is greater than one, a second concentration of the first material is applied. In some embodiments, the first concentration of the first material is applied to at least one of at least some of the region 102 or the third sub-region 302C at a first time, such as when the E/D ratio is less than one. In some embodiments, the second concentration of the first material is applied to at least one of at least some of the region 102 or the second sub-region 302B at a second time, such as when the E/D ratio is greater than one. In some embodiments, the first concentration of the first material is applied to at least one of at least some of the region 102 or the first sub-region 302A at a third time, such as when the E/D ratio is less than one. In some embodiments, the first sub-region is associated with the first concentration of the first material, the second sub-region is associated with the second concentration of the first material, and the third sub-region is associated with the first concentration of the first material. Accordingly, 310 is a graph of depth versus doping concentration for region 102. For example, 310A corresponds to the first sub-region 302A, 310B corresponds to the second sub-region 302B, and 310C corresponds to the third sub-region 302C. It will be appreciated that at least some of 310A and at least some of 310C are associated with a same doping concentration, such as a first doping concentration, while 310B is associated with a different doping concentration, such as a second doping concentration, at least because 310B is associated with 302B and a different E/D ratio than 310A, 310C, and 302A, 302C, for example. In this way, the concentration of the first material is controlled based on the E/D ratio. In some embodiments, a Ge concentration associated with at least one of 302A, 302B, or 302C is at least about twenty percent to at least about fifty percent, for example. However, it will be appreciated that in other embodiments, the Ge concentration is at least one of less than twenty percent or greater than fifty percent.

Figure 4:
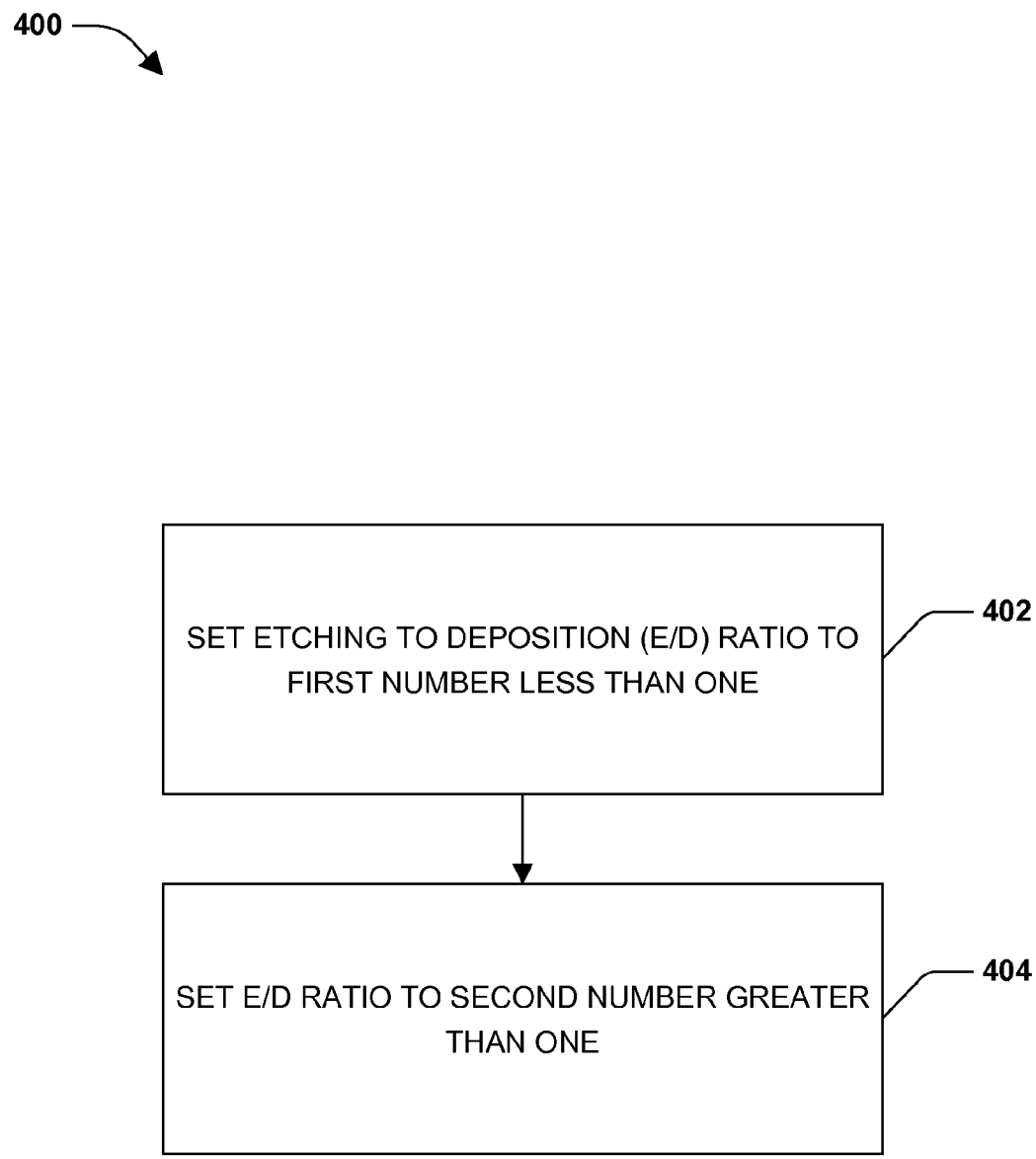
FIG. 4 is a flow diagram of an example method for controlling a surface profile for a region of a semiconductor, according to some embodiments.

FIG. 4 is a flow diagram of an example method 400 for controlling a surface profile for a region of a semiconductor, according to some embodiments. For example, the method 400 comprises setting an etching to deposition (E/D) ratio to a first number less than one during formation of a region at 402. In some embodiments, the method 400 comprises setting the E/D ratio to the first number at a first time. Additionally, the method 400 comprises setting the E/D ratio to the second number at a second time, the second time after the first time. In some embodiments, the method 400 comprises returning the E/D ratio to the first number at a third time, the third time after the second time. At 404, the method 400 comprises setting the E/D ratio to a second number greater than one, thus controlling a surface profile for the region. According to some aspects, the method 400 comprises applying a first concentration of a first material to the region at the first time and applying a second concentration of the first material to the region at the second time. In some embodiments, the method 400 comprises applying the first concentration of the first material at a third time, the third time after the second time. For example, in some embodiments, the first material is Germanium (Ge). In some embodiments, the method 400 comprises determining the second concentration based on a change in the E/D ratio from the first number to the second number. For example, the second concentration is determined based on a rate of change from the first number to the second number. In some embodiments, at least one of the second time or setting the E/D ratio to the second number is based on a thickness of the region. In some embodiments, forming the region is based on at least one of epitaxial growth or chemical vapor deposition (CVD).

Figure 5:
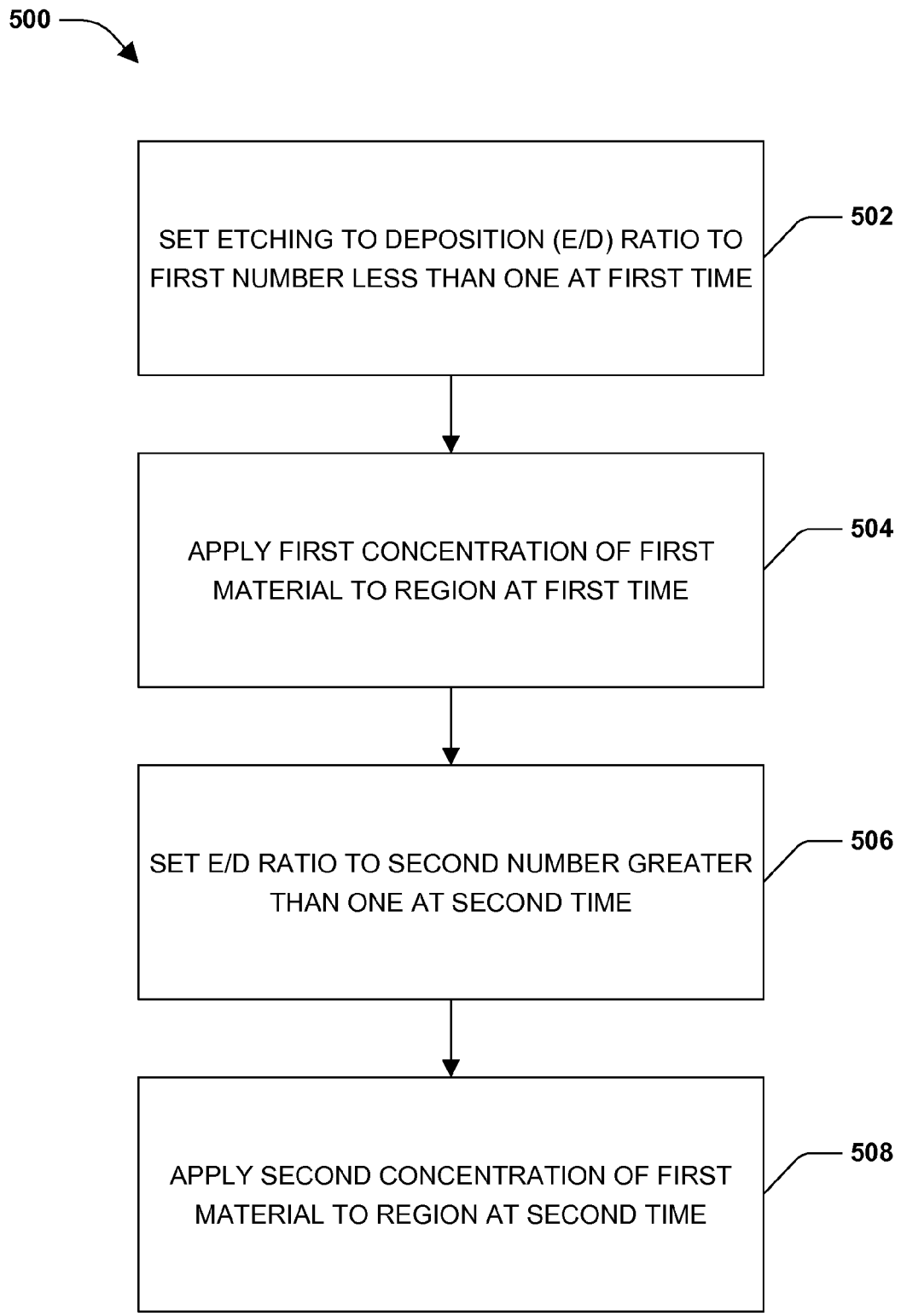
FIG. 5 is a flow diagram of an example method for controlling a surface profile for a region of a semiconductor, according to some embodiments.

FIG. 5 is a flow diagram of an example method 500 for controlling a surface profile for a region of a semiconductor, according to some embodiments. In some embodiments, the method 500 comprises forming the region based on at least one of epitaxial growth or chemical vapor deposition (CVD). At 502, the method 500 comprises setting an etching to deposition (E/D) ratio to a first number less than one at a first time during formation of a region. At 504, the method 500 comprises applying a first concentration of a first material to the region at the first time. At 506, the method 500 comprises setting the E/D ratio to a second number greater than one at a second time, the second time after the first time. For example, the E/D ratio is set to the second number based on a thickness of the region. At 508, the method 500 comprises applying a second concentration of the first material to the region at the second time, thus controlling a surface profile for the region. For example, the second concentration is determined based on at least one of the first number, the second number, or a difference between the second number and the first number. In some embodiments, the method 500 comprises returning the E/D ratio to the first number at a third time, the third time after the second time. Additionally, the method 500 comprises applying the first concentration of the first material to the region at a third time, the third time after the second time. In some embodiments, the method 500 comprises at least one of applying a first concentration of Germanium (Ge) to the region at the first time, applying a second concentration of Germanium (Ge) to the region at the second time, or applying a first concentration of Germanium (Ge) to the region at a third time.

According to some aspects, a method for controlling a surface profile for a region of a semiconductor is provided, comprising setting an etching to deposition (E/D) ratio to a first number less than one during formation of a region. In some embodiments, the method comprises setting the E/D ratio to a second number greater than one, thus controlling a surface profile for the region.

According to some aspects, a method for controlling a surface profile for a region of a semiconductor is provided, comprising setting an etching to deposition (E/D) ratio to a first number less than one at a first time during formation of a region. In some embodiments, the method comprises applying a first concentration of a first material to the region at the first time. In some embodiments, the method comprises setting the E/D ratio to a second number greater than one at a second time, the second time after the first time. In some embodiments, the method comprises applying a second concentration of the first material to the region at the second time, thus controlling a surface profile for the region.

According to some aspects, region of a semiconductor associated with a controlled surface profile is provided, comprising a first sub-region at a surface of a region, the first sub-region associated with a first concentration of a first material. In some embodiments, the region comprises a second sub-region below at least some of the first sub-region. Additionally, the second sub-region is associated with a second concentration of the first material and the second concentration is different than the first concentration. In some embodiments, the region comprises a third sub-region below at least some of the second sub-region. Additionally, the third sub-region is associated with the first concentration of the first material.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the region, surface of the region, first sub-region, second sub-region, third sub-region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, sputtering techniques such as magnetron or ion beam sputtering, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method for controlling a surface profile for a region of a semiconductor, comprising:
    applying a first concentration of a first material to a region while an etching to deposition (E/D) ratio is set to a first number less than one and greater than zero to expand the region; and
    applying a second concentration of the first material to the region while the E/D ratio is set to a second number greater than one to trim at least a portion of the region, wherein trimming the at least a portion of the region is configured to control a surface profile for the region and wherein the first concentration is different than the second concentration.

2. The method of claim 1, comprising:
    setting the E/D ratio to the first number at a first time; and
    setting the E/D ratio to the second number at a second time, the second time after the first time.

3. The method of claim 2, comprising returning the E/D ratio to the first number at a third time, the third time after the second time.

4. The method of claim 3, comprising applying the first concentration of the first material to the region at the third time.

5. The method of claim 1, the first concentration greater than the second concentration.

6. The method of claim 2, comprising determining the second time based on a thickness of the region.

7. The method of claim 1, comprising setting the E/D ratio to the second number based on a thickness of the region.

8. The method of claim 1, comprising forming the region based on at least one of epitaxial growth or chemical vapor deposition (CVD).

9. The method of claim 1, the first material comprising Germanium (Ge).

10. A method for controlling a surface profile for a region of a semiconductor, comprising:
    setting an etching to deposition (E/D) ratio to a first number less than one at a first time during formation of a region;
    applying a first concentration of a first material to the region at the first time;
    setting the E/D ratio to a second number greater than one at a second time during the formation of the region, the second time after the first time; and
    applying a second concentration of the first material to the region at the second time, thus controlling a surface profile for the region.

11. The method of claim 10, comprising determining the second concentration based on at least one of the first number, the second number, or a difference between the second number and the first number.

12. The method of claim 10, comprising returning the E/D ratio to the first number at a third time, the third time after the second time.

13. The method of claim 10, comprising applying the first concentration of the first material to the region at a third time, the third time after the second time.

14. The method of claim 10, the second number based on a thickness of the region.

15. The method of claim 10, the first concentration comprising a first concentration of Germanium (Ge).

16. The method of claim 10, the second concentration comprising a second concentration of Germanium (Ge).

17. The method of claim 15, comprising applying the first concentration of Germanium (Ge) to the region at a third time, the third time after the second time.

18. A method for forming a region of a semiconductor, comprising:
- setting an etching to deposition (E/D) ratio to a first number less than one;
- applying a first concentration of Germanium while the E/D ratio is set to the first number to form a first sub-region of a region;
- setting the E/D ratio to a second number greater than one responsive to the first sub-region being formed; and
- applying a second concentration of Germanium while the E/D ratio is set to the second number to reduce a roughness of a surface of the first sub-region, the second concentration less than the first concentration.

19. The method of claim 18, comprising:
- returning the E/D ratio to the first number after the applying a second concentration; and
- applying the first concentration of Germanium responsive to the returning to form a second sub-region of the region.

20. The method of claim 18, the first number greater than zero.

* * * * *